(12) United States Patent
Chiu et al.

(10) Patent No.: US 11,670,607 B2
(45) Date of Patent: Jun. 6, 2023

(54) ELECTRONIC PACKAGE

(71) Applicant: SILICONWARE PRECISION INDUSTRIES CO., LTD., Taichung (TW)

(72) Inventors: Chih-Hsien Chiu, Taichung (TW); Wen-Jung Tsai, Taichung (TW); Chia-Chu Lai, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 31 days.

(21) Appl. No.: 17/233,885

(22) Filed: Apr. 19, 2021

(65) Prior Publication Data
US 2022/0262747 A1 Aug. 18, 2022

(30) Foreign Application Priority Data

Feb. 18, 2021 (TW) .................................. 110105521

(51) Int. Cl.
| | |
|---|---|
| *H01L 23/66* | (2006.01) |
| *H01Q 1/22* | (2006.01) |
| *H01Q 1/24* | (2006.01) |
| *H01Q 9/04* | (2006.01) |
| *H01L 23/31* | (2006.01) |
| *H01L 23/498* | (2006.01) |
| *H01L 23/552* | (2006.01) |
| *H01L 23/00* | (2006.01) |

(52) U.S. Cl.
CPC .......... *H01L 23/66* (2013.01); *H01L 23/3121* (2013.01); *H01L 23/49822* (2013.01); *H01L 23/49838* (2013.01); *H01L 23/552* (2013.01); *H01L 24/16* (2013.01); *H01Q 1/2283* (2013.01); *H01Q 1/242* (2013.01); *H01Q 9/0414* (2013.01); *H01L 2223/6677* (2013.01); *H01L 2224/16227* (2013.01); *H01L 2924/3025* (2013.01)

(58) Field of Classification Search
None
See application file for complete search history.

(56) References Cited

U.S. PATENT DOCUMENTS 11,289,433 B2 * 3/2022 Tseng .................... H01L 23/055

* cited by examiner

*Primary Examiner* — Long Pham
(74) *Attorney, Agent, or Firm* — Kelly & Kelley, LLP

(57) ABSTRACT

An electronic package is provided, including at least an electronic element and at least an antenna structure disposed on a carrier structure. The antenna structure includes a base portion configured with an antenna body and a plurality of support portions disposed on the base portion. As such, the base portion is disposed over the carrier structure through the support portions and a plurality of open areas are formed between the base portion and the carrier structure to serve as an air gap, thereby effectively improving the performance gain and efficiency of the antenna body.

16 Claims, 6 Drawing Sheets

ELECTRONIC PACKAGE

BACKGROUND

1. Technical Field

The present disclosure relates to semiconductor packages, and more particularly, to an electronic package having an antenna structure.

2. Description of Related Art

Currently, wireless communication technologies have been widely applied in various types of consumer electronic products such as mobile phones and tablet computers to facilitate receiving or transmitting of various wireless signals. To facilitate portability of the consumer electronic products and easy access to Internet, wireless communication modules are becoming lighter, thinner, shorter and smaller. Therein, patch antennas have been widely applied in wireless communication modules of electronic products due to their advantages of small size, light weight and easy fabrication.

FIG. 1 is a schematic perspective view of a conventional wireless communication module. Referring to FIG. 1, the wireless communication module 1 has: a substrate 10, a plurality of electronic elements 11 disposed on and electrically connected to the substrate 10, an antenna structure 12 formed on the substrate 10, and an encapsulant 13 formed on the substrate 10. The substrate 10 is a circuit board having a rectangular shape. The antenna structure 12 is of a planar type and has an antenna body 120 and a conductive wire 121 electrically connecting the antenna body 120 and the electronic elements 11. The encapsulant 13 covers the electronic elements 11 and a portion of the conductive wire 121.

Further, a 5G communication system needs more antenna configurations to improve signal quality and transmission rate. However, in the conventional wireless communication module 1, since the antenna structure 12 is of a planar type, the function of the antenna structure 12 is limited and hence the wireless communication module 1 cannot provide required electrical performance for operating the 5G communication system. As such, it is difficult to meet the requirement of antenna operation of the 5G communication system.

Therefore, how to overcome the above-described drawbacks of the prior art has become an urgent issue in the art.

SUMMARY

In view of the above-described drawbacks of the prior art, the present disclosure provides an electronic package, which comprises: a carrier structure having a circuit layer; an electronic element disposed on the carrier structure and electrically connected to the circuit layer; and an antenna structure disposed on the carrier structure and comprising a base portion configured with an antenna body and at least a first support portion disposed on the base portion, wherein the base portion is disposed over the carrier structure through the first support portion and at least an open area is formed between the base portion and the carrier structure, and wherein the antenna body has at least an antenna layer arranged on the base portion and at least an antenna extension portion embedded in the first support portion for electrically connecting the antenna layer and the circuit layer.

In an embodiment, the antenna body has a plurality of antenna layers separated from one another and correspondingly arranged on two sides of the base portion. For example, the plurality of antenna layers transmit signals in a coupling manner.

In an embodiment, the first support portion is bonded to the carrier structure through a conductor. The electronic package further comprises an external connecting pad arranged between the first support portion and the conductor and electrically connected to the antenna extension portion. In another embodiment, the conductor contains a solder material. Alternatively, the conductor has a composite structure.

In an embodiment, the electronic package further comprises a second support portion disposed on the base portion, wherein the base portion is disposed over the carrier structure through the first support portion and the second support portion, and the first antenna layer is not electrically conductive to an inside of the second support portion. Further, the first support portion and the second support portion are bonded to the carrier structure through a conductor. The electronic package further comprises an external connecting pad arranged between the first support portion and the conductor and/or the second support portion and the conductor. In another embodiment, the conductor contains a solder material. Alternatively, the conductor has a composite structure. Further, the first support portion and the second support portion divide a plurality of open areas as an air gap.

In an embodiment, the open area has a height of at least 400 μm.

In an embodiment, the height of the open area is not equal to a thickness of the base portion.

In an embodiment, the electronic package further comprises an encapsulant encapsulating the electronic element.

In an embodiment, the electronic package further comprises a shielding structure covering the electronic element.

In an embodiment, the electronic package further comprises at least a base body disposed on the carrier structure, wherein the first support portion of the antenna structure is disposed over the base body. For example, the base body has an additional space communicating with the open area. In another embodiment, the base body has another antenna extension portion electrically connected to the antenna extension portion.

According to the present disclosure, an open area is formed between the carrier structure and the base portion so as to effectively improve the performance gain and efficiency of the antenna body and strengthen the electric field intensity of the antenna body and thereby facilitate signal transmission. Compared with the prior art, the electronic package of the present disclosure can meet the requirement of antenna operation of a 5G communication system.

Further, since the antenna structure is bonded onto the carrier structure through a conductor, it is easy to assemble and also facilitate adjustment of the height of the air gap so as to improve the design flexibility of the antenna structure. Therefore, the present disclosure improves the process yield.

BRIEF DESCRIPTION OF THE DRAWINGS

FIG. 3A-1 is a schematic cross-sectional view of an electronic package according to a second embodiment of the present disclosure.

FIG. 3A-2 is a partially enlarged view of FIG. 3A-1.

FIG. 3B-1 is a schematic cross-sectional view of an electronic package according to a third embodiment of the present disclosure.

FIG. 3B-2 is a partially enlarged view of FIG. 3B-1.

DETAILED DESCRIPTION OF THE EMBODIMENTS

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

Figure 2A:
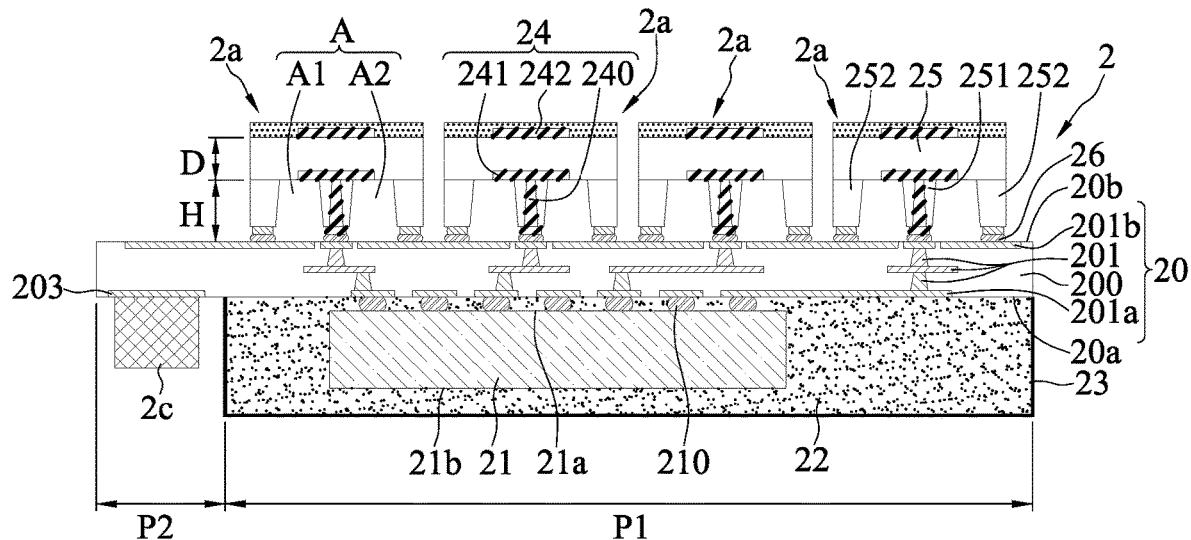
FIG. 2A is a schematic cross-sectional view of an electronic package according to a first embodiment of the present disclosure.

FIG. 2A is a schematic cross-sectional view of an electronic package 2 according to a first embodiment of the present disclosure. Referring to FIG. 2A, the electronic package 2 has: a carrier structure 20, at least an electronic element 21 disposed on the carrier structure 20, an encapsulant 22 encapsulating the electronic element 21, and a plurality of (e.g., four) antenna structures 2a disposed on the carrier structure 20.

The carrier structure 20 has a first surface 20a defined with a packaging region P1 and a peripheral region P2 adjacent to the packaging region P1 and a second surface 20b opposite to the first surface 20a.

In an embodiment, the carrier structure 20 is a circuit structure having a core layer or a coreless circuit structure. For example, the carrier structure 20 is a packaging substrate having at least an insulating layer 200 and a plurality of circuit layers 201, 201a, 201b formed on the insulating layer 200. For example, the circuit layers 201, 201a, 201b are fan-out type copper circuit layers formed in an RDL (redistribution layer) manner, and the insulating layer 200 is made of a dielectric material such as polybenzoxazole (PBO), polyimide (PI), prepreg (PP), etc.

Figure 2B:
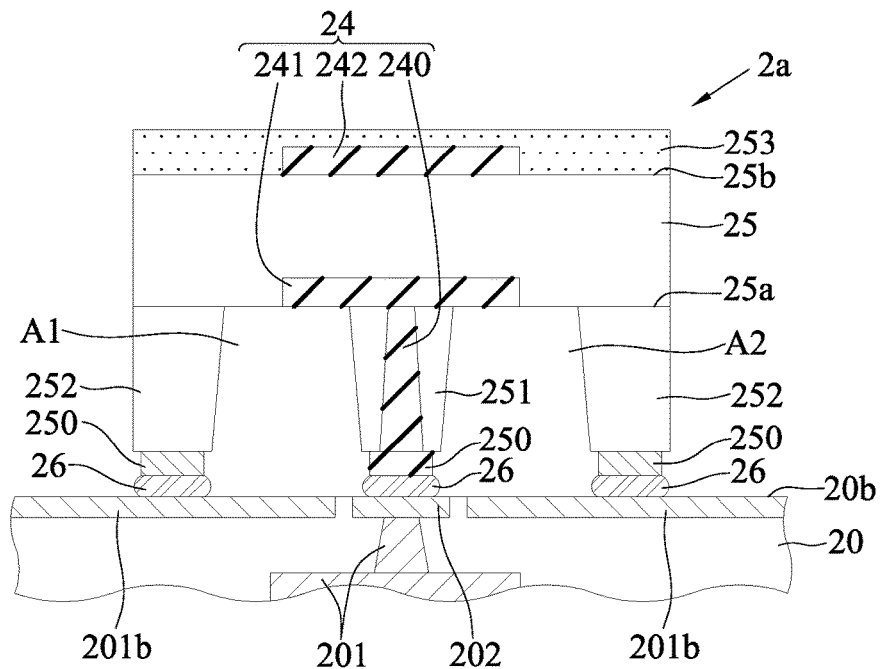
FIG. 2B is a partially enlarged view of FIG. 2A.

Further, the circuit layer 201b of the carrier structure 20 serves as a ground plane, which has at least a pad portion 202, as shown in FIG. 2B. For example, the pad portion 202 is arranged on the circuit layer 201b of the second surface 20b of the carrier structure 20.

It should be understood that the carrier structure 20 can be other component used for carrying an electronic element 21 such as a chip. For example, the carrier structure 20 is a silicon interposer, but the present disclosure is not limited to as such.

The electronic element 21 is an active element such as a radio-frequency semiconductor chip, a passive element such as a resistor, a capacitor or an inductor, or a combination thereof. The electronic element 21 is disposed on the packaging region P1 of the first surface 20a of the carrier structure 20 and electrically connected to the circuit layer 201a of the first surface 20a of the carrier structure 20.

In an embodiment, the electronic element 21 is an active element such as a semiconductor chip with a function of transmitting 5G millimeter-waves (mmWaves). The electronic element 21 has opposite active and inactive surfaces 21a, 21b, and the active surface 21a of the electronic element 21 is flip-chip disposed on the carrier structure 20 and electrically connected to the circuit layer 201a through a plurality of conductive bumps 210 made of such as a solder material. Further, if desired, the conductive bumps 210 can be encapsulated with an underfill. Alternatively, the electronic element 21 can be electrically connected to the circuit layer 201a through a plurality of bonding wires (not shown), or in direct contact with the circuit layer 201a, but the present disclosure is not limited to as such.

The encapsulant 22 is formed on the entire packaging region P1 of the first surface 20a of the carrier structure 20 and encapsulates the electronic element 21. Further, the encapsulant 22 can encapsulate the conductive bumps 210 according to needs.

In an embodiment, the encapsulant 22 is made of an insulating material such as polyimide, a dry film, an epoxy resin or a molding compound, but the present disclosure is not limited to as such.

Further, referring to FIG. 2A, the encapsulant 22 can cover the inactive surface 21b of the electronic element 21 according to needs. Alternatively, the inactive surface 21b of the electronic element 21 can be exposed from the encapsulant 22 (not shown).

Furthermore, a shielding structure 23 can be formed on an outer surface of the encapsulant 22 for covering the electronic element 21 and selectively electrically connected to the circuit layers 201, 201a, 201b. For example, the shielding structure 23 is made of metal or other material, such as a material selected from copper (Cu), nickel (Ni), iron (Fe), aluminum (Al) and stainless steel (SUS), and formed by such as electroplating, chemical plating, physical vapor deposition, sputtering or other suitable method (e.g., vertically disposing a metal frame).

In addition, the encapsulant 22 is not formed on the peripheral region P2 of the first surface 20a of the carrier structure 20, and the circuit layer 201a on the peripheral region P2 is exposed from the encapsulant 22 to serve as a contact 203 for connecting with a connector 2c. As such, the electronic package 2 can be connected to other electronic module (not shown) through the connector 2c. For example, the electronic module is an antenna element such as a sub-6 GHz wavelength antenna, and thus the electronic package 2 and other antenna module can be integrated into a same electronic device such as a smartphone.

Each of the antenna structures 2a is disposed on the second surface 20b of the carrier structure 20, and has a base portion 25 configured with an antenna body 24, a first support portion 251 disposed on the base portion 25, and a plurality of second support portions 252 disposed on the base portion 25. As such, the base portion 25 is disposed over the second surface 20b of the carrier structure 20 through the first support portion 251 and the second support portions 252, at least an air gap A is formed between the base portion 25 and the carrier structure 20, and the first support portion 251 electrically connects the antenna body 24 and the carrier structure 20.

In an embodiment, referring to FIG. 2B, the base portion 25 is a plate body defined with opposite first and second sides 25a, 25b, and the first support portion 251 and the second support portions 252 are disposed on the first side 25a of the base portion 25. Further, the antenna body 24 has a first antenna layer 241 and a second antenna layer 242 separated from one another and correspondingly arranged on the first side 25a and the second side 25b of the base portion 25, respectively. For example, the base portion 25 adopts a packaging substrate type, such as a packaging substrate having a core layer and a circuit structure, or a coreless circuit structure, and the first antenna layer 241 and the second antenna layer 242 having a small thickness are formed on a dielectric material by sputtering, evaporation, electroplating, electroless plating, chemical plating or foiling. The first antenna layer 241 can adopt a patch structure, and the second antenna layer 242 can adopt a parasitic patch structure, and if desired, an insulating protective layer 253 can be formed on the second side 25b of the base portion 25 for covering the second antenna layer 242.

Further, the first antenna layer 241 and the second antenna layer 242 transmit signals in a coupling manner. For example, the first antenna layer 241 and the second antenna layer 242 can generate radiation energy by alternating voltage, alternating current or radiation variation, and the radiation energy is an electromagnetic field, which causes the first antenna layer 241 and the second antenna layer 242 to be electromagnetically coupled with one another, thereby causing antenna signals to be transmitted between the first antenna layer 241 and the second antenna layer 242. The antenna body 24 has an antenna extension portion 240 embedded in the first support portion 251 to serve as a feed line. The antenna extension portion 240 penetrates through the first support portion 251 and is electrically connected to the first antenna layer 241. If desired, an external connecting pad 250 can be formed on the first support portion 251 and bonded to the antenna extension portion 240. Further, the external connecting pad 250 and the pad portion 202 of the circuit layer 201b of the carrier structure 20 are bonded through a conductor 26. As such, the first antenna layer 241 is electrically connected to the circuit layer 201b through the antenna extension portion 240. Therefore, the antenna body 24 can be grounded through the circuit layer 201b.

Further, at least one external connecting pad 250 can be formed on the second support portions 252 and bonded to the circuit layer 201b through a conductor 26. As such, the antenna structures 2a and the electronic element 21 can be grounded to the carrier structure 20, but the first antenna layer 241 is not electrically conductive to the inside of the second support portions 252. For example, the conductors 26 are of a single structure that made of a solder material. The first support portion 251 and the second support portions 252 can be made of a same base material, e.g., adopt a packaging substrate type, the antenna extension portion 240 and the external connecting pads 250 are formed on a dielectric material by sputtering, evaporation, electroplating, electroless plating, chemical plating and so on, and a cavity is formed by etching to serve as the air gap A. Therefore, the base portion 25, the first support portion 251 and the second support portions 252 of the same plate material constitute the antenna structure 2a.

Furthermore, the first support portion 251 and the second support portions 252 are of a post or wall shape, and the first support portion 251 is positioned between two of the second support portions 252 (or the plurality of second support portions 252 is positioned around the first support portion 251), thus dividing a plurality of open areas A1, A2 from the air gap A. For example, the height H of the open areas A1, A2 (or the air gap A) is at least 400 μm and not equal to the thickness D of the base portion 25.

Therefore, the electronic package 2 of the present disclosure is an AiP (Antenna in Package) package, which uses a packaging substrate having a cavity as a main body of the antenna structure 2a (the base portion 25, the first support portion 251 and the second support portions 252) so as to form the air gap A between the second surface 20b (or the circuit layer 201b serving as the ground plane) of the carrier structure 20 and the first side 25a (or the first antenna layer 241) of the base portion 25. Therefore, compared with the prior art, the air gap A between the first antenna layer 241 (fed patch) and the circuit layer 201b (ground layer) effectively improves the performance gain and efficiency of the antenna body 24 and strengthens the electric field intensity of the antenna body 24 so as to facilitate signal transmission.

Further, since the antenna structure 2a is bonded onto the carrier structure 20 through the conductors 26 containing a solder material, it is not only easy to assemble, but also facilitates adjustment of the height H of the air gap A so as to cause the design of the height H of the air gap A to be flexible.

Furthermore, referring to FIG. 2A, if the height H of the air gap A is greater than the thickness D of the base portion 25, the electronic package 2 can obtain a larger gain.

In addition, if the height H of the air gap A is less than the thickness D of the base portion 25 (not shown), the antenna structure 2a can be used for a special bandwidth, and the overall thickness of the antenna structure 2a can be reduced (if the size of the first antenna layer 241 can be reduced, the overall size of the antenna body 24 can be reduced).

Figure 1:
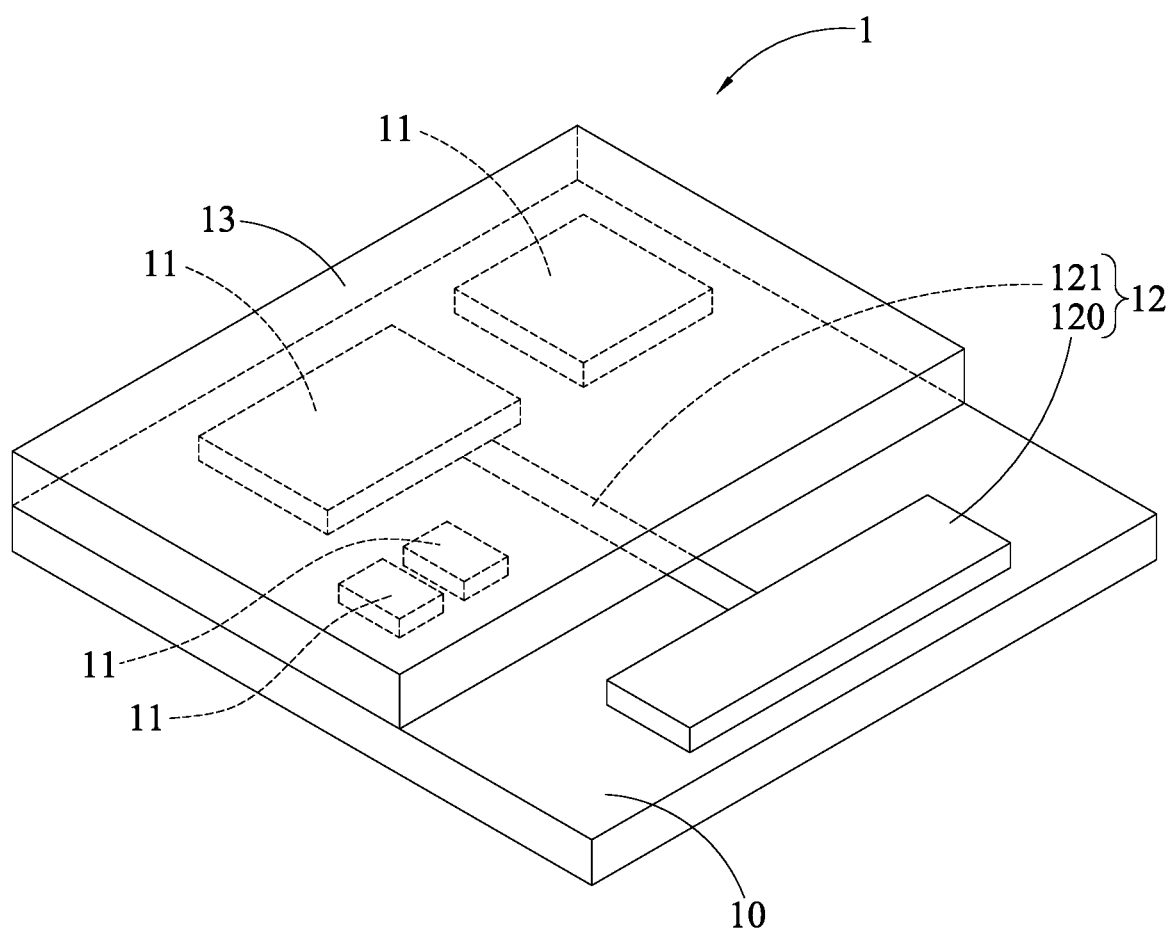
FIG. 1 is a schematic perspective view of a conventional wireless communication module.
Figures 1, 3A:
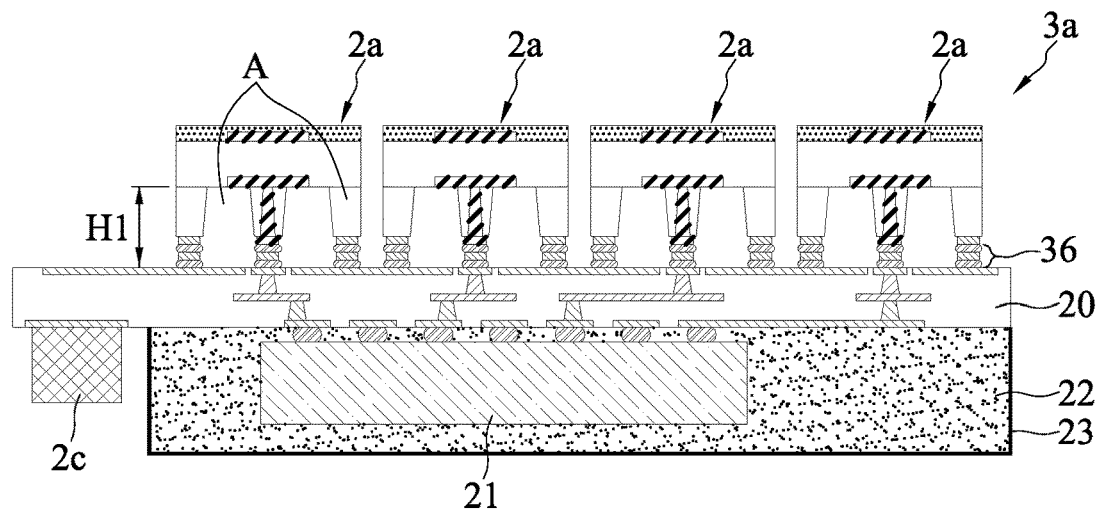

FIG. 3A-1 is a schematic cross-sectional view of an electronic package 3a according to a second embodiment of the present disclosure. The second embodiment differs from the first embodiment in the structure of the conductors 36, and the same components will not be repeated below for conciseness.

Figures 2, 3A:
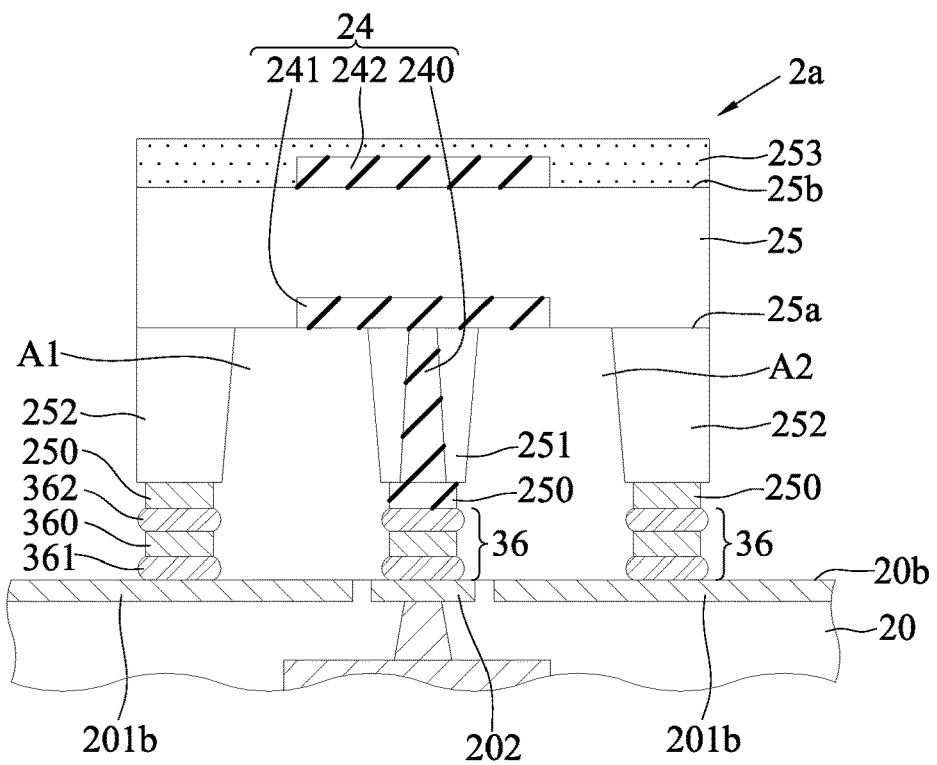

Referring to FIGS. 3A-1 and 3A-2, each of the conductors 36 has a composite structure composed of two solder layers 361, 362 and a metal layer 360 between the two solder layers 361, 362. The two solder layers 361, 362 are bonded to the circuit layer 201b and the external connecting pad 250, respectively.

In an embodiment, the metal layer 360 can be made of a metal material such as Cu, Ni, Fe, Al or stainless steel (SUS), and formed by electroplating, chemical plating, physical vapor deposition, sputtering or other suitable method.

According to the electronic package 3a of the present disclosure, the air gap A formed between the first antenna layer 241 and the circuit layer 201b effectively improves the performance gain and efficiency of the antenna body 24 and strengthens the electric field intensity of the antenna body 24 so as to facilitate signal transmission.

Further, since the antenna structure 2a is bonded onto the carrier structure 20 through the conductors 36 containing a solder material, it is not only easy to assemble, but also increases the distance between the first side 25a of the base portion 25 and the second surface 20b of the carrier structure 20 so as to increase the height H1 of the air gap A (greater than the height H of the first embodiment) and hence enable the electronic package 3a to obtain a larger gain.

Figures 1, 3B:
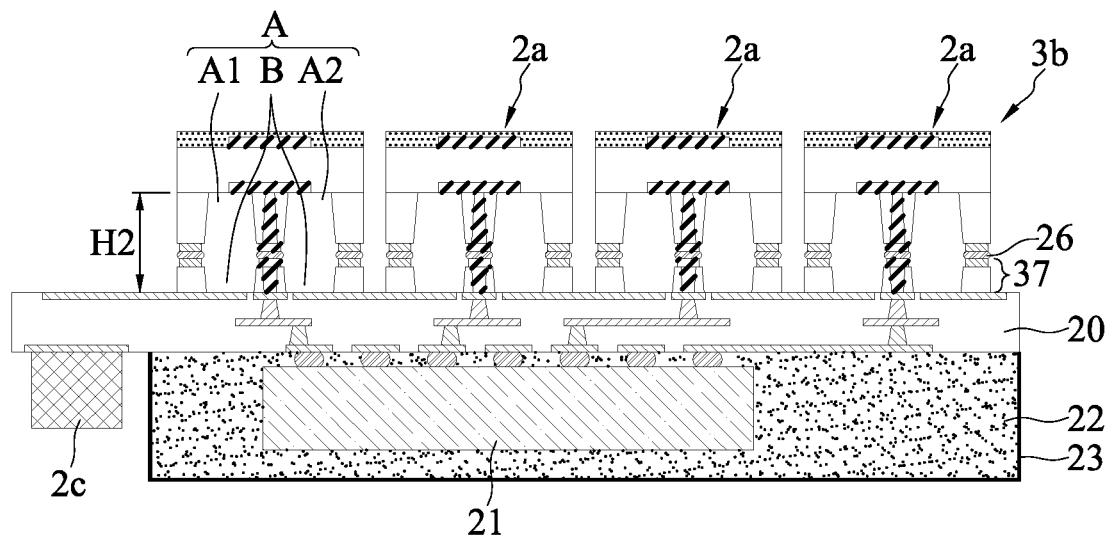
Figures 2, 3B:
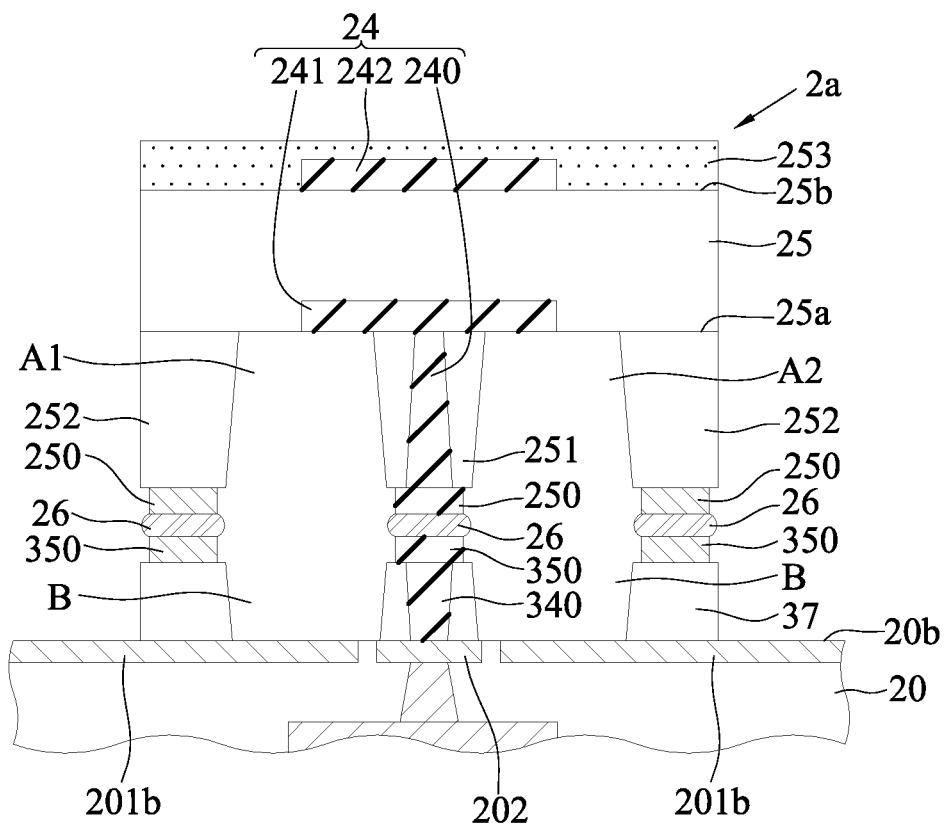

FIG. 3B-1 is a schematic cross-sectional view of an electronic package 3b according to a third embodiment of the present disclosure. The third embodiment differs from the first embodiment in the addition of a base body, and the same components will not be repeated below for conciseness.

Referring to FIG. 3B-1, at least a base body 37 is disposed on the second surface 20b of the carrier structure 20 and bonded to the conductor 26 so as to cause the antenna structure 2a to be disposed over the base body 37.

In an embodiment, referring to FIG. 3B-2, the structure of the base body 37 corresponds to the first support portion 251 and the second support portions 252. For example, the base body 37 adopts a packaging substrate type, an antenna extension portion 340 and a plurality of external connecting pads 350 are formed on a dielectric material by sputtering, evaporation, electroplating, electroless plating, chemical plating and so on, and then a cavity is formed by etching so as to provide an additional space B. The antenna extension portion 340 of the base body 37 is in contact with and bonded to the pad portion 202 for grounding the antenna structure 2a.

Further, the base body 37 is bonded to the first support portion 251 and the second support portions 252 through the conductor 26 so as to cause the antenna extension portion 240 of the antenna structure 2a to be electrically conductive to the antenna extension portion 340 of the base body 37 through the two external connecting pads 250, 350 (which are connected with the conductor 26), thereby grounding the antenna body 24 of the antenna structure 2a through the circuit layer 201b.

Furthermore, the additional space B corresponds in position to and communicates with the open areas A1, A2 so as to increase the range of the air gap A.

According to the electronic package 3b of the present disclosure, the air gap A between the first antenna layer 241 and the circuit layer 201b effectively improves the performance gain and efficiency of the antenna body 24 and strengthens the electric field intensity of the antenna body 24 so as to facilitate signal transmission.

Further, since the antenna structure 2a is bonded onto the carrier structure 20 through the base body 37 and the conductors 36, it is not only easy to assemble, but also increases the distance between the first side 25a of the base portion 25 and the second surface 20b of the carrier structure 20 so as to increase the height H2 of the air gap A (greater than the height H1 of the second embodiment) and hence enable the electronic package 3b to obtain a larger gain.

Figure 4:
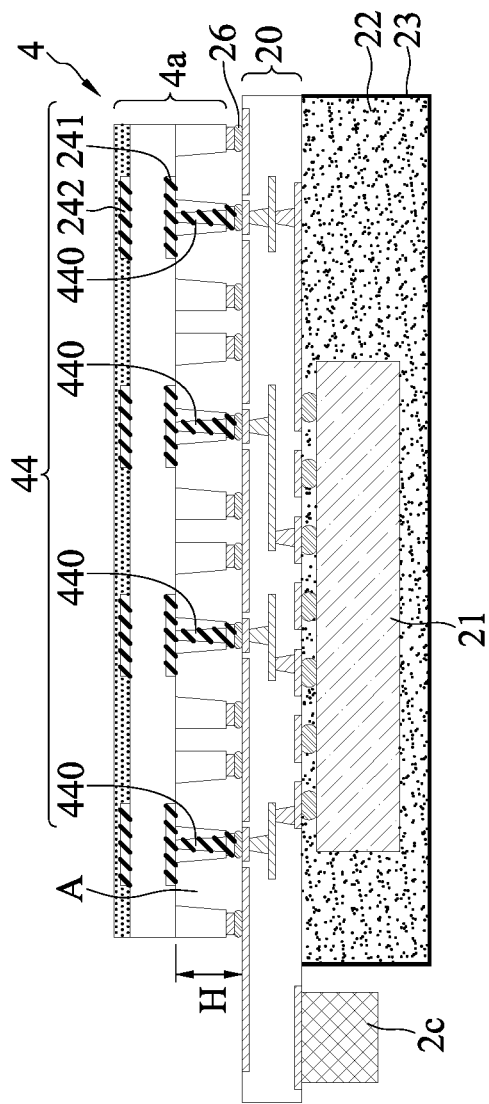
FIG. 4 is a schematic cross-sectional view of an electronic package according to a fourth embodiment of the present disclosure.

FIG. 4 is a schematic cross-sectional view of an electronic package 4 according to a fourth embodiment of the present disclosure. The fourth embodiment differs from the first embodiment in the number of the antenna structure, and the same components will not be repeated below for conciseness.

Referring to FIG. 4, a single antenna structure 4a is disposed over the second surface 20b of the carrier structure 20. The antenna body 44 of the antenna structure 4a has a plurality of antenna extension portions 440, and a plurality of air gaps A are formed between the plurality of antenna extension portions 440.

According to the electronic package 4 of the present disclosure, the plurality of air gaps A further improve the performance gain and efficiency of the antenna body 44 and strengthen the electric field intensity of the antenna body 44 so as to facilitate signal transmission.

In addition, since the antenna structure 4a is bonded onto the carrier structure 20 through the conductors 26 containing a solder material, it is not only easy to assemble, but also increases the height H of the air gap A and hence enable the electronic package 4 to obtain a larger gain.

Figure 5A:
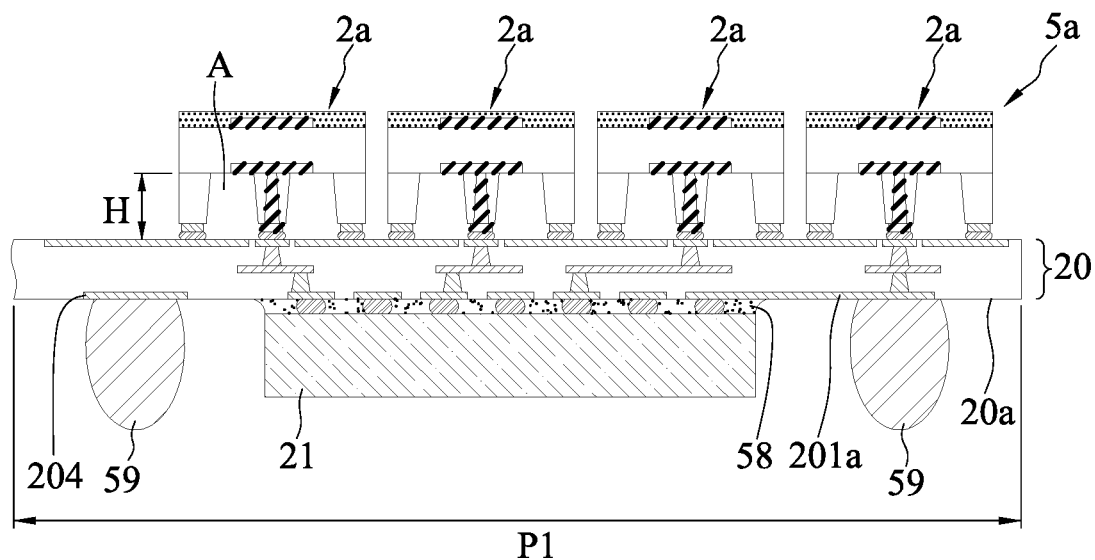
FIG. 5A is a schematic partial cross-sectional view of an electronic package according to a fifth embodiment of the present disclosure.

FIG. 5A is a schematic cross-sectional view of an electronic package 5a according to a fifth embodiment of the present disclosure. The fifth embodiment differs from the first embodiment in the packaging manner, and the same components will not be repeated below for conciseness.

Referring to FIG. 5A, a packaging layer 58 such as an underfill is formed on the first surface 20a of the carrier structure 20 to encapsulate the conductive bumps 210, and no encapsulant 22 is formed on the packaging region P1 to encapsulate the electronic element 21.

Figure 5B:
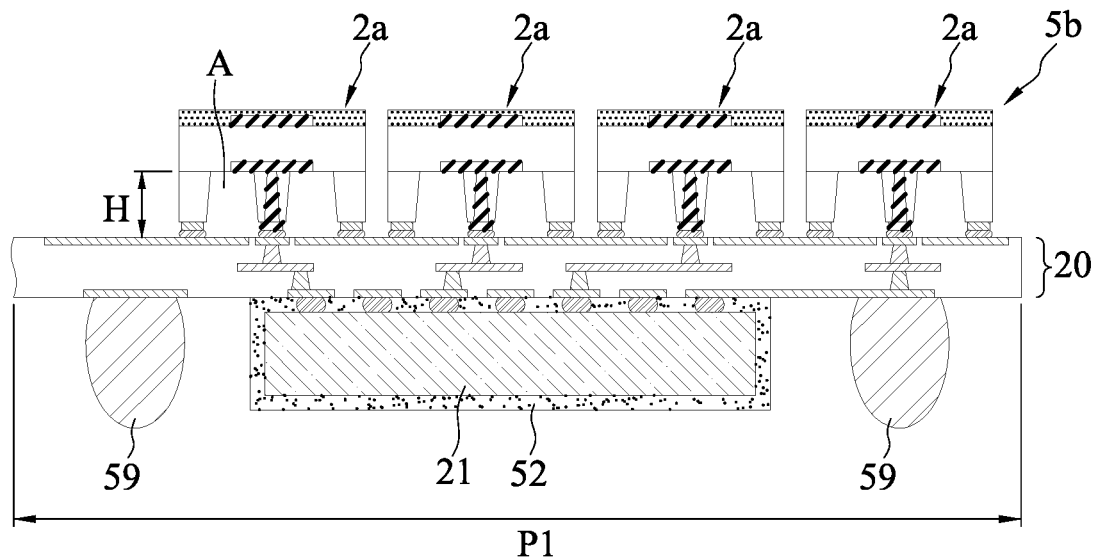
FIG. 5B shows another aspect of FIG. 5A.

In an embodiment, portions of the circuit layer 201a can be exposed from the first surface 20a of the carrier structure 20 to serve as conductive pads 204. As such, a plurality of conductive elements 59 such as solder balls can be bonded to the conductive pads 204 so as to electrically connect the electronic package 5a onto an electronic device such as a circuit board (not shown). In another embodiment, referring to an electronic package 5b of FIG. 5B, an encapsulant 52 can be formed on a portion of the packaging region P1 to encapsulate the electronic element 21.

According to the electronic package 5a, 5b of the present disclosure, the air gap A between the first antenna layer (fed patch) and the circuit layer (ground layer) effectively improves the performance gain and efficiency of the antenna body and strengthens the electric field intensity of the antenna body so as to facilitate signal transmission.

Further, since the antenna structure 2a is bonded onto the carrier structure 20 through the conductors containing a solder material, it is not only easy to assemble, but also increases the height H of the air gap A and hence enable the electronic package 5a, 5b to obtain a larger gain.

Therefore, the present disclosure provides an electronic package 2, 3a, 3b, 4, 5a, 5b, which has: a carrier structure 20 having a plurality of circuit layers 201, 201a, 201b; at least an electronic element 21 disposed on the carrier structure 20 and electrically connected to the circuit layer 201a; and at least an antenna structure 2a, 4a disposed on the carrier structure 20.

The antenna structure 2a, 4a is disposed on the carrier structure 20. The antenna structure 2a, 4a has a base portion 25 configured with an antenna body 24 and at least a first support portion 251 disposed on the base portion 25. The base portion 25 is disposed over the carrier structure 20 through the first support portion 251 and at least an open area A1, A2 is formed between the base portion 25 and the carrier structure 20. The antenna body 24 has a first antenna layer 241 and a second antenna layer 242 arranged on the base portion 25 and at least an antenna extension portion 240 embedded in the first support portion 251 for electrically connecting the first antenna layer 241 and the second antenna layer 242 to the circuit layer 201b.

In an embodiment, the antenna body 24 has first and second antenna layers 241, 242 separated from one another and correspondingly arranged on two opposite sides of the base portion 25. For example, the first and second antenna layers 241, 242 transmit signals in a coupling manner.

In an embodiment, the first support portion 251 is bonded to the carrier structure 20 through a conductor 26, 36. For example, an external connecting pad 250 is arranged between the first support portion 251 and the conductor 26, 36 and electrically connected to the antenna extension portion 240. The conductor 26, 36 contains a solder material. Alternatively, the conductor 36 has a composite structure.

In an embodiment, a second support portion 252 is further disposed on the base portion 25, the base portion 25 is disposed over the carrier structure 20 through the first support portion 251 and the second support portion 252, and the first antenna layer 241 is not electrically conductive to the inside of the second support portion 252. For example, the first support portion 251 and the second support portion 252 are bonded to the carrier structure 20 through a conductor 26, 36. Further, an external connecting pad 250 is arranged between the first support portion 251 and the conductor 26, 36 and/or the second support portion 252 and the conductor 26, 36. Further, the conductor 26, 36 contains a solder material. Alternatively, the conductor 36 has a composite structure.

In another aspect, the first support portion 251 and the second support portion 252 divide a plurality of open areas A1, A2 as an air gap A.

In an embodiment, the height H of the open area A1, A2 is at least 400 μm.

In an embodiment, the height H of the open area A1, A2 is not equal to the thickness D of the base portion 25.

In an embodiment, the electronic package 2, 3a, 3b, 4, 5b further has an encapsulant 22 encapsulating the electronic element 21.

In an embodiment, the electronic package 2, 3a, 3b, 4, 5b further has a shielding structure 23 covering the electronic element 21.

In an embodiment, the electronic package 3b further has at least a base body 37 disposed on the carrier structure 20, and the first support portion 251 of the antenna structure 2a is disposed over the base body 37. For example, the base body 37 has an additional space B communicating with the open area A1, A2. In another embodiment, the base body 37 has an antenna extension portion 340 electrically connected to the antenna extension portion 240.

According to the present disclosure, an air gap is formed between the first antenna layer (fed patch) and the circuit layer (ground layer) so as to effectively improve the performance gain and efficiency of the antenna body and strengthen the electric field intensity of the antenna body and thereby facilitate signal transmission. As such, the electronic package of the present disclosure can meet the requirement of antenna operation of a 5G communication system.

Further, since the antenna structure is bonded onto the carrier structure through a conductor, it is not only easy to assemble, but also facilitates adjustment of the height of the air gap so as to improve the design flexibility of the antenna structure. Therefore, the present disclosure improves the process yield.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
   a carrier structure having a circuit layer;
   an electronic element disposed on the carrier structure and electrically connected to the circuit layer; and
   an antenna structure disposed on the carrier structure and comprising a base portion configured with an antenna body and at least a first support portion disposed on the base portion, wherein the base portion is disposed over the carrier structure through the first support portion and at least an open area is formed between the base portion and the carrier structure, and wherein the antenna body has at least an antenna layer arranged on the base portion and at least an antenna extension portion embedded in the first support portion for electrically connecting the antenna layer and the circuit layer.

2. The electronic package of claim 1, wherein the antenna body has a plurality of antenna layers separated from one another and correspondingly arranged on two sides of the base portion.

3. The electronic package of claim 2, wherein the plurality of antenna layers transmit signals in a coupling manner.

4. The electronic package of claim 1, wherein the first support portion is bonded to the carrier structure through a conductor.

5. The electronic package of claim 4, further comprising an external connecting pad arranged between the first support portion and the conductor and electrically connected to the antenna extension portion.

6. The electronic package of claim 1, further comprising a second support portion disposed on the base portion, wherein the base portion is disposed over the carrier structure through the first support portion and the second support portion, and the first antenna layer is free from being electrically conductive to an inside of the second support portion.

7. The electronic package of claim 6, wherein the first support portion and the second support portion are bonded to the carrier structure through a conductor.

8. The electronic package of claim 7, further comprising an external connecting pad arranged between the first support portion and the conductor.

9. The electronic package of claim 7, further comprising an external connecting pad arranged between the second support portion and the conductor.

10. The electronic package of claim 6, wherein the first support portion and the second support portion divide a plurality of open areas as an air gap.

11. The electronic package of claim 1, wherein the open area has a height of at least 400 μm.

12. The electronic package of claim 1, wherein the height of the open area is not equal to a thickness of the base portion.

13. The electronic package of claim 1, further comprising a shielding structure covering the electronic element.

14. The electronic package of claim 1, further comprising at least a base body disposed on the carrier structure, wherein the first support portion of the antenna structure is disposed over the base body.

15. The electronic package of claim 14, wherein the base body has an additional space communicating with the open area.

16. The electronic package of claim 14, wherein the base body has another antenna extension portion electrically connected to the antenna extension portion.

* * * * *